United States Patent
Tseng et al.

(10) Patent No.: US 7,915,638 B2
(45) Date of Patent: Mar. 29, 2011

(54) SYMMETRIC BIDIRECTIONAL SILICON-CONTROLLED RECTIFIER

(75) Inventors: Tang-Kuei Tseng, Jhudong Township, Hsinchu County (TW); Che-Hao Chuang, Hsinchu (TW); Ryan Hsin-Chin Jiang, Taipei (TW); Ming-Dou Ker, Jhu-bei (TW)

(73) Assignee: Amazing Microelectronic Corp., Taipei County (TW)

( * ) Notice: Subject to any disclaimer, the term of this patent is extended or adjusted under 35 U.S.C. 154(b) by 335 days.

(21) Appl. No.: 12/113,912

(22) Filed: May 1, 2008

(65) Prior Publication Data

US 2009/0032838 A1 Feb. 5, 2009

(30) Foreign Application Priority Data

Jul. 31, 2007 (TW) ................. 96127914 A

(51) Int. Cl.
*H01L 29/66* (2006.01)
(52) U.S. Cl. .. 257/133; 257/124; 257/360; 257/E29.221
(58) Field of Classification Search .................. 257/360, 257/133, 124, E29.221
See application file for complete search history.

(56) References Cited

U.S. PATENT DOCUMENTS

| 5,072,273 | A | 12/1991 | Avery |
| 5,877,534 | A * | 3/1999 | Williams et al. ............... 257/355 |
| 6,258,634 | B1 | 7/2001 | Wang et al. |
| 6,365,924 | B1 | 4/2002 | Wang et al. |
| 6,960,792 | B1 * | 11/2005 | Nguyen ........................ 257/173 |
| 7,034,363 | B2 | 4/2006 | Chen |
| 7,145,187 | B1 | 12/2006 | Vashchenko et al. |

* cited by examiner

*Primary Examiner* — Jerome Jackson, Jr.
*Assistant Examiner* — Dale Page
(74) *Attorney, Agent, or Firm* — Ming Chow; Sinorica LLC

(57) ABSTRACT

The present invention discloses a symmetric bidirectional silicon-controlled rectifier, which comprises: a substrate; a buried layer formed on the substrate; a first well, a middle region and a second well, which are sequentially formed on the buried layer side-by-side; a first semiconductor area and a second semiconductor area both formed inside the first well; a third semiconductor area formed in a junction between the first well and the middle region, wherein a first gate is formed over a region between the second and third semiconductor areas; a fourth semiconductor area and a fifth semiconductor area both formed inside the second well; a sixth semiconductor area formed in a junction between the second well and the middle region, wherein a second gate is formed over a region between the fifth and sixth semiconductor areas.

18 Claims, 5 Drawing Sheets

SYMMETRIC BIDIRECTIONAL SILICON-CONTROLLED RECTIFIER

BACKGROUND OF THE INVENTION

1. Field of the Invention

The present invention relates to a silicon-controller rectifier, particularly to a symmetric bidirectional silicon-controlled rectifier, which has a small area and a high electrostatic-discharge protection capability. The present invention applies to an ESD protection element for I/O signals with both positive and negative voltage level.

2. Description of the Related Art

With the advance of semiconductor technology, the dimensions of MOS (Metal Oxide Semiconductor) devices have been reduced to a submicron or even deep-submicron scale. The submicron or deep-submicron technology uses so thin a gate oxide layer that only a few volts higher voltage is enough to cause gate oxide damage. In general environments, electrostatic voltage maybe reach thousands or even several ten thousands volts, which will damage integrated circuits (IC). Therefore, once having accumulated to a given amount in IC, electrostatic charge should be released by ESD device. The silicon-controlled rectifier, which has a low turn-on resistance, low capacitance, low power consumption and high-power current conduction capability, is exactly an effective ESD (Electro-Static Discharge) protection element for IC.

Currently, the bidirectional silicon-controlled rectifier (SCR) has become the mainstream in the market of the ESD protection circuits for I/O signals with both positive and negative voltage level, and many researches are also dedicated to the bidirectional silicon-controlled rectifier. U.S. Pat. Nos. 6,258,634, 6,365,924 and 7,034,363 all disclosed symmetric bidirectional silicon-controlled rectifiers. As the silicon-controlled rectifiers disclosed in the abovementioned patents are all directly fabricated on a silicon substrate, they have lower breakdown voltages and can only apply to generic IC processes. A U.S. Pat. No. 6,960,792 disclosed an symmetric bidirectional silicon-controlled rectifier with annular layout, which consumes a larger layout area. Furthermore, the trigger speed is also deeply influenced by the structure thereof. Therefore, the device proposed in U.S. Pat. No. 6,960,7922 cannot provide an effective ESD protection function. A U.S. Pat. No. 5,072,273 disclosed a low trigger voltage silicon-controlled rectifier. However, it can only operate unidirectionally. The proposed structure cannot apply to an ESD protection circuit for I/O signal with both positive and negative voltage level.

Accordingly, the present invention proposes a novel symmetric bidirectional silicon-controlled rectifier to overcome the abovementioned problems and drawbacks.

SUMMARY OF THE INVENTION

The primary objective of the present invention is to provide a symmetric bidirectional silicon-controlled rectifier, which can prevent electrostatic charge from damaging a semiconductor element.

Another objective of the present invention is to provide a symmetric bidirectional silicon-controlled rectifier, which has a small area and a high electrostatic discharge (ESD) protection capability.

Yet another objective of the present invention is to provide a symmetric bidirectional silicon-controlled rectifier, which has an adjustable trigger voltage and an adjustable holding voltage to implement a better design and a better protection.

Still another objective of the present invention is to provide a symmetric bidirectional silicon-controlled rectifier, which has an embedded MOS structure to enhance the turn-on speed and high ESD robustness.

Further another objective of the present invention is to provide a symmetric bidirectional silicon-controlled rectifier, which applies to a high-voltage technology to function as an ESD protection device for I/O signals with both positive and negative voltage level.

Still further another objective of the present invention is to provide a symmetric bidirectional silicon-controlled rectifier, which has a small parasitic capacitance to reduce signal loss.

To achieve the abovementioned objectives, the present invention proposes a symmetric bidirectional silicon-controlled rectifier, which comprises: a second conduction type substrate; a first conduction type buried layer formed on the substrate; a second conduction type first well, a first conduction type middle region and a second conduction type second well, which are side-by-side formed on the first buried layer; a first semiconductor area and a second semiconductor area both formed inside the first well; a third semiconductor area formed in a junction between the first well and the middle region, wherein a first gate is formed over a region between the second and third semiconductor areas, and the first gate, the first semiconductor area and the second semiconductor area are connected to an anode; a fourth semiconductor area and a fifth semiconductor area both formed inside the second well; a sixth semiconductor area formed in a junction between the second well and the middle region, wherein a second gate is formed over a region between the fifth and sixth semiconductor areas, and the second gate, the fourth semiconductor area and the fifth semiconductor area are connected to a cathode.

The present invention also proposes another embodiment of a symmetric bidirectional silicon-controlled rectifier, wherein the first and fourth semiconductor areas are of the first conduction type, and the second, third, fifth and sixth semiconductor areas are of the second conduction type.

The present invention also proposes yet another embodiment of a symmetric bidirectional silicon-controlled rectifier, wherein the first and fourth semiconductor areas are of the second conduction type, and the second, third, fifth and sixth semiconductor areas are of the first conduction type.

The present invention also proposes still another embodiment of a symmetric bidirectional silicon-controlled rectifier, wherein the first, third, fourth and sixth semiconductor areas are of the second conduction type, and the second and fifth semiconductor areas are of the first conduction type.

The present invention also proposes further another embodiment of a symmetric bidirectional silicon-controlled rectifier, wherein the first, third, fourth and sixth semiconductor areas are of the first conduction type, and the second and fifth semiconductor areas are of the second conduction type.

Below, various embodiments as described would allow a better understanding the objectives, technical contents, characteristics and accomplishments of the present invention.

DETAILED DESCRIPTION OF THE INVENTION

Figure 1:
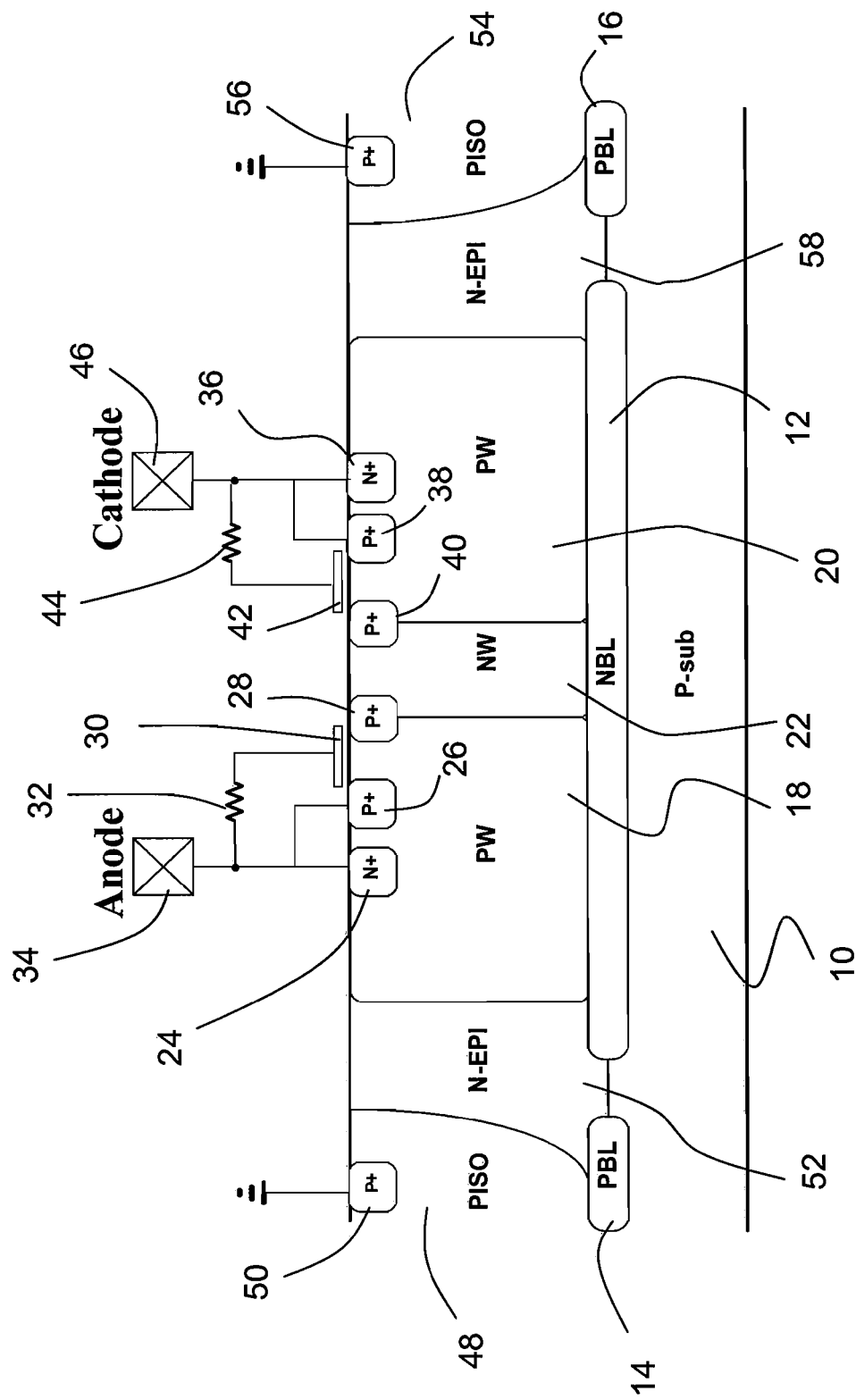
FIG. 1 is a diagram schematically showing an embodiment of a symmetric silicon-controlled rectifier according to the present invention.

Refer to FIG. 1 a diagram schematically showing an embodiment of a symmetric silicon-controlled rectifier according to the present invention. In this embodiment, the symmetric silicon-controlled rectifier of the present invention comprises: a P-type substrate 10; an N-type first buried layer 12 formed on the substrate 10; and P-type second and third buried layer 14 and 16 respectively formed at two sides of the first buried layer 12.

A P-type first well 18, a middle region 22 and a P-type second well 20 are side-by-side formed on the first buried layer 12. The middle region 22 is interposed between the first and second wells 18 and 20 and may be an undoped epitaxial region or an arbitrary N-type region, such as an N-type epitaxial region or an N-type well. An N-type first semiconductor area 24 and a P-type second semiconductor area 26 are both formed inside the first well 18. A P-type third semiconductor area 28 is formed in a junction between the first well 18 and the middle region 22. A gate 30 is formed over a region between the second and third semiconductor areas 26 and 28. The first and second semiconductor areas 24 and 26 are connected to an anode 34, and the gate 30 is also connected to the anode 34 via a resistor 32 cascaded to the gate 30.

An N-type fourth semiconductor area 36 and a P-type fifth semiconductor area 38 are both formed inside the second well 20. A P-type sixth semiconductor area 40 is formed in a junction between the second well 20 and the middle region 22. A gate 42 is formed over a region between the fifth and sixth semiconductor areas 38 and 40. The fourth and fifth semiconductor areas 36 and 38 are connected to a cathode 46, and the gate 42 is also connected to the cathode 46 via a resistor 44 cascaded to the gate 42.

A P-type third well 48 is formed on the second buried layer 14. A P-type seventh semiconductor area 50 is formed inside the third well 48 for grounding. An N-type undoped epitaxial layer 52 is formed in between the first and third wells 18 and 48. A P-type fourth well 54 is formed on the third buried layer 16. A P-type eighth semiconductor area 56 is formed inside the fourth well 54 for grounding. An N-type undoped epitaxial layer 58 is formed in between the second and fourth wells 20 and 54. A fifth well (not shown in the drawing) and a sixth well (not shown in the drawing) may further be formed in the epitaxial layer 52 and the epitaxial layer 58 respectively.

The critical breakdown voltage of this embodiment can be lowered by one MOSFET (Metal-Oxide-Semiconductor Field Effect Transistor) which includes the gate 30, the second semiconductor area 26 and the third semiconductor area 28 and the other MOSFET which includes the gate 42, the fifth semiconductor area 38 and the sixth semiconductor area 40. Thereby, the trigger voltage of the embodiment is regulated, and the turn-on speed is improved.

The embodiment described above adopts a P-type substrate, and the conduction types of other elements vary with the conduction type of the substrate. For example, the N-type first buried layer, the N-type middle region, etc., are adopted to match with the P-type substrate. If a N-type substrate may also be adopted, the conduction types of other elements should be varied with the conduction type of the substrate. The characteristic of conduction type interchangeability also applies to the following embodiments. Further, separation structures, such as oxide layers, shallow trenches, or undoped semiconductor areas, may also be formed in between nearby semiconductor area.

Figure 2:
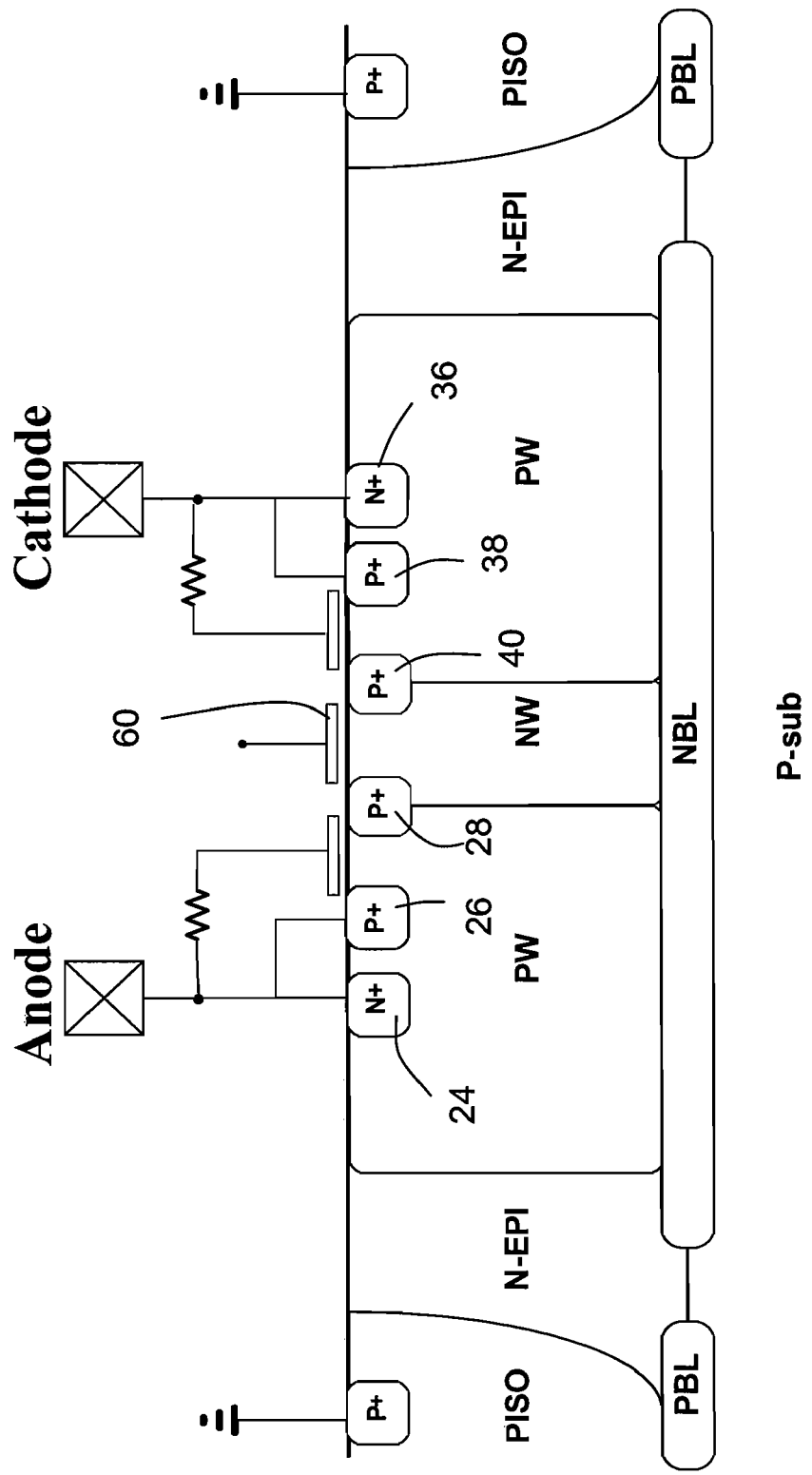
FIG. 2 is a diagram schematically showing another embodiment of a symmetric silicon-controlled rectifier according to the present invention.

Refer to FIG. 2 a diagram schematically showing another embodiment of a symmetric silicon-controlled rectifier according to the present invention, wherein a floating gate 60 is formed over a region between the third and sixth semiconductor areas 28 and 40 shown in FIG. 1 to reduce the spacing between the third and sixth semiconductor areas 28 and 40 so as to regulate the holding voltage.

Figure 3:
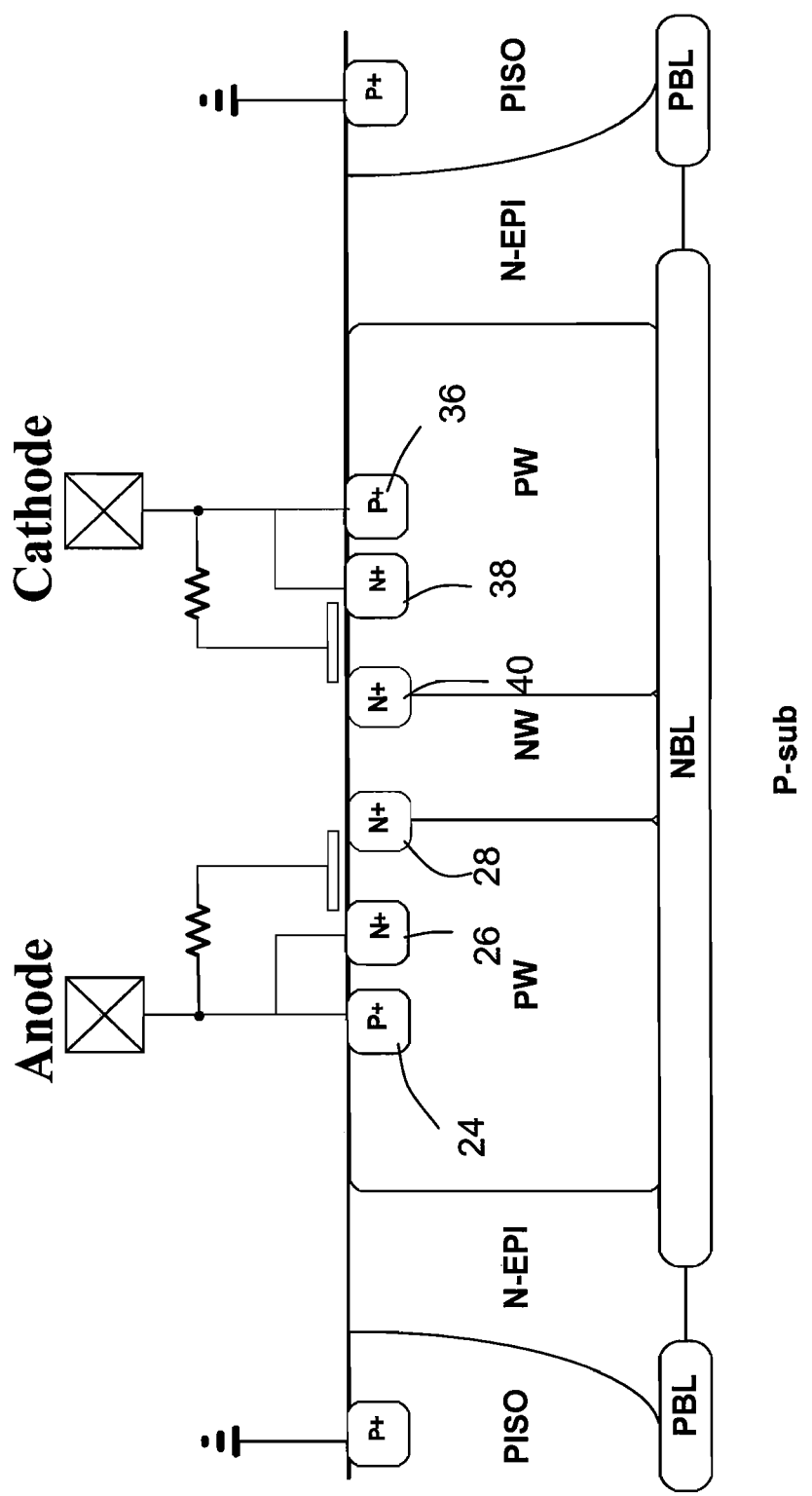
FIG. 3 is a diagram schematically showing yet another embodiment of a symmetric silicon-controlled rectifier according to the present invention.

Refer to FIG. 3 a diagram schematically showing yet another embodiment of a symmetric silicon-controlled rectifier according to the present invention, wherein the conduction type of the first semiconductor area 24 shown in FIG. 1 is changed from N-type to P-type; the conduction types of the second and third semiconductor areas 26 and 28 are changed from P-type to N-type; the conduction type of the fourth semiconductor area 36 is changed from N-type to P-type; the conduction types of the fifth and sixth semiconductor areas 38 and 40 are changed from P-type to N-type.

Further, a floating gate for regulating the holding voltage (not shown in the drawing) may also be formed over a region between the third and sixth semiconductor areas 28 and 40.

In this embodiment, the breakdown voltage will be lowered by one MOSFET which includes the gate 30, the second semiconductor area 26 and the third semiconductor area 28 and the other MOSFET which includes the gate 42, the fifth semiconductor area 38 and the sixth semiconductor area 40. Thereby, the trigger voltage of the embodiment can be regulated.

Figure 4:
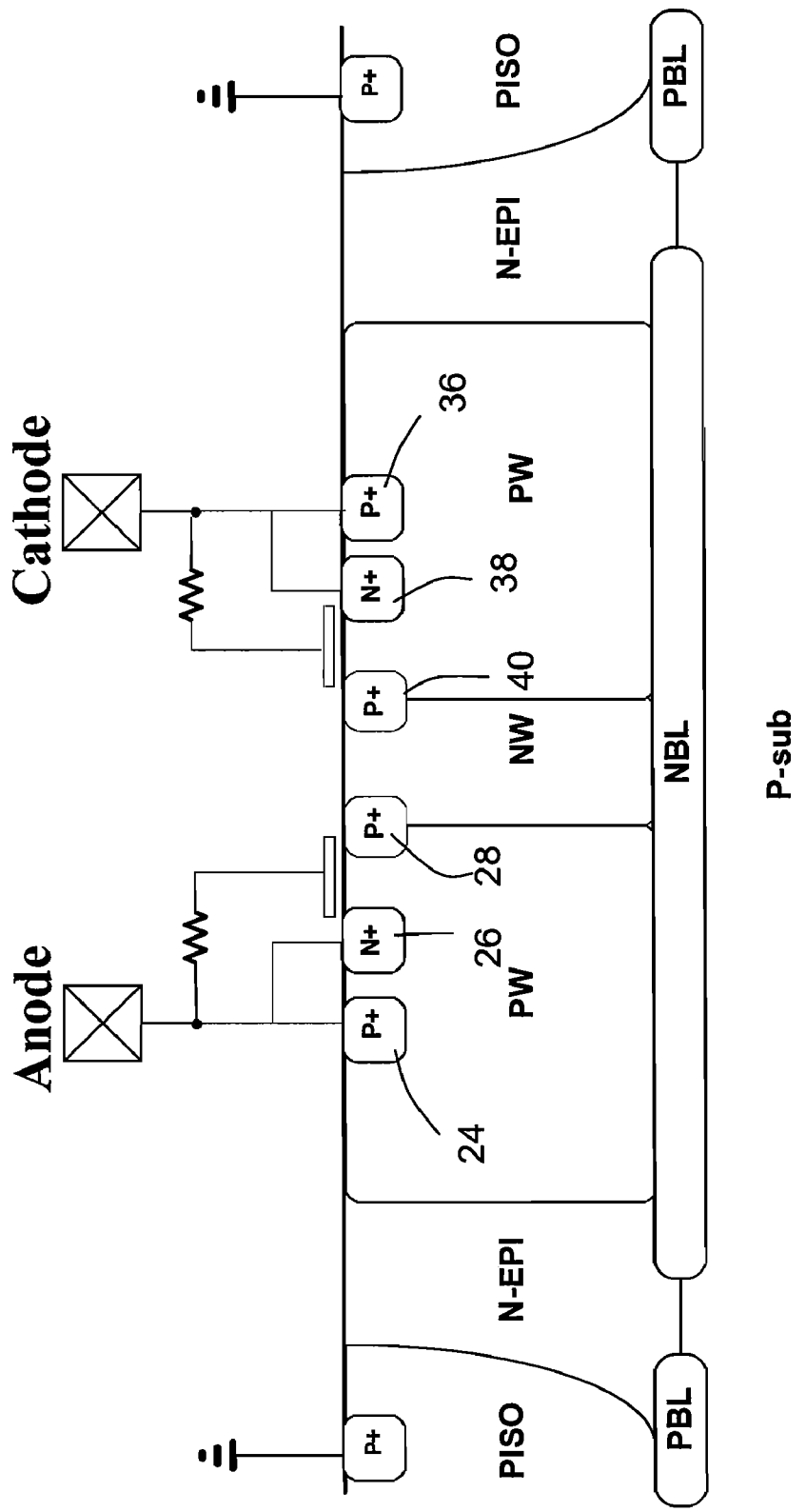
FIG. 4 is a diagram schematically showing still another embodiment of a symmetric silicon-controlled rectifier according to the present invention.

Refer to FIG. 4 a diagram schematically showing still another embodiment of a symmetric silicon-controlled rectifier according to the present invention, wherein the conduction type of the first semiconductor area 24 shown in FIG. 1 is changed from N-type to P-type; the conduction type of the second semiconductor area 26 is changed from P-type to N-type; the conduction type of the fourth semiconductor area 36 is changed from N-type to P-type; the conduction type of the fifth semiconductor area 38 is changed from P-type to N-type.

In this embodiment, a floating gate (not shown in the drawing) may also be formed over a region between the third and sixth semiconductor areas 28 and 40.

Figure 5:
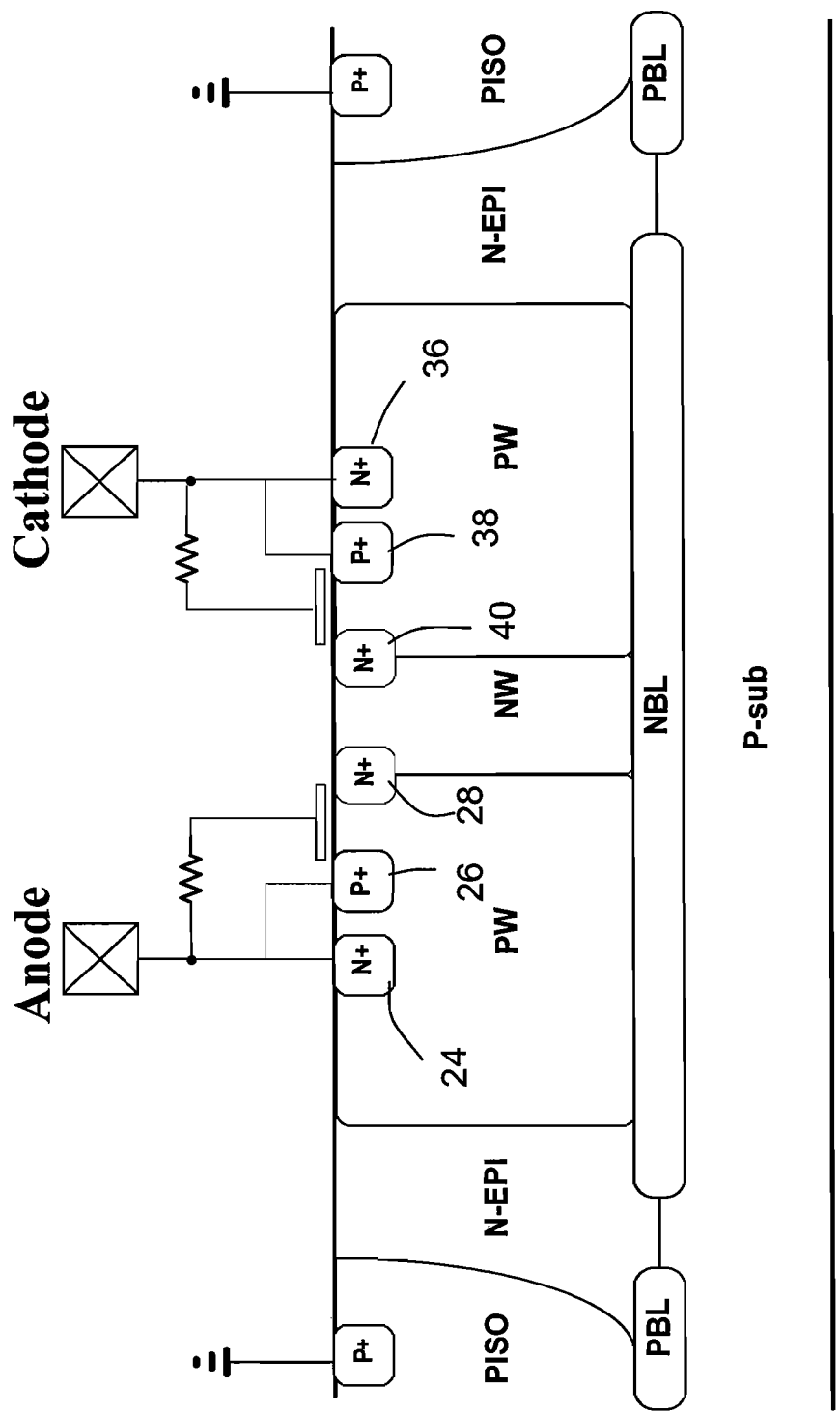
FIG. 5 is a diagram schematically showing further another embodiment of a symmetric silicon-controlled rectifier according to the present invention.

Refer to FIG. 5 a diagram schematically showing further another embodiment of a symmetric silicon-controlled rectifier according to the present invention. The structure of this embodiment is basically similar to that of the embodiment shown in FIG. 1 except the conduction types of the third and sixth semiconductor areas 28 and 40 are changed from P-type to N-type. In this embodiment, a floating gate may also be formed over a region between the third and sixth semiconductor areas 28 and 40.

In conclusion, the present invention proposes a symmetric bidirectional silicon-controlled rectifier having a small-area and a high ESD protection capability. Further, a MOSFET is embedded in the SCR of the present invention to improve the turn-on speed and the ESD protection capability. Besides, the MOSFET enables the symmetric bidirectional SCR of the present invention to have an adjustable holding voltage and an adjustable trigger voltage so as to apply to various I/O circuits. Consequently, the present invention also can apply to a high-voltage CMOS chip and function as a protection element for I/O signals with both positive and negative voltage level. Furthermore, the present invention with low leakage current and low parasitic capacitance can reduce signal loss in normal operation condition.

Those described above are only the preferred embodiments to exemplify the present invention but not to limit the scope of the present invention. Any equivalent modification or variation according to the spirit of the present invention is to be also included within the scope of the present invention.

What is claimed is:

1. A symmetric bidirectional silicon-controlled rectifier comprising:
    a substrate of a second conduction type;
    a first buried layer of a first conduction type and formed on said substrate;
    a first well and a second well both of said second conduction type and formed on said first buried layer;
    a middle region of said first conduction type and formed in between said first well and said second well;
    a first semiconductor area and a second semiconductor area both formed inside said first well;
    a third semiconductor area formed in a junction between said first well and said middle region, wherein a first gate is formed over a region between said second semiconductor area and said third semiconductor area;
    a fourth semiconductor area and a fifth semiconductor area both formed inside said second well; and
    a sixth semiconductor area formed in a junction between said second well and said middle region, wherein a second gate is formed over a region between said fifth semiconductor area and said sixth semiconductor area.

2. A symmetric bidirectional silicon-controlled rectifier according to claim 1 further comprising:
    both a second buried layer and a third buried layer of said second conduction type and formed on said substrate and respectively at two sides of said first buried layer;
    a third well of said second conduction type and formed on said second buried layer;
    a seventh semiconductor area of said second conduction type, formed inside said third well and connected to a terminal electric potential;
    a fourth well of said second conduction type and formed on said third buried layer; and
    an eighth semiconductor area of said second conduction type, formed inside said fourth well and connected to a terminal electric potential.

3. A symmetric bidirectional silicon-controlled rectifier according to claim 2, wherein a first epitaxial layer is formed in between said first well and said third well; a second epitaxial layer is formed in between said second well and said fourth well; said first epitaxial layer and said second epitaxial layer are both of said first conduction type.

4. A symmetric bidirectional silicon-controlled rectifier according to claim 2, wherein a fifth well is formed in between said first well and said third well; a sixth well is formed in between said second well and said fourth well; said fifth well and said sixth well are both of said first conduction type.

5. A symmetric bidirectional silicon-controlled rectifier according to claim 1, wherein said first gate is connected an anode via a resistor cascaded to said first gate, and said second gate is connected to a cathode via a resistor cascaded to said second gate.

6. A symmetric bidirectional silicon-controlled rectifier according to claim 1 further comprising a floating gate formed over a region between said third semiconductor area and said sixth semiconductor area.

7. A symmetric bidirectional silicon-controlled rectifier according to claim 1, wherein said first and fourth semiconductor areas are of said first conduction type; said second, third, fifth and sixth semiconductor areas are of said second conduction type.

8. A symmetric bidirectional silicon-controlled rectifier according to claim 1, wherein said first and fourth semiconductor areas are of said second conduction type;
    said second, third, fifth and sixth semiconductor areas are of said first conduction type.

9. A symmetric bidirectional silicon-controlled rectifier according to claim 1, wherein said first, third, fourth and sixth semiconductor areas are of said second conduction type; said second and fifth semiconductor areas are of said first conduction type.

10. A symmetric bidirectional silicon-controlled rectifier according to claim 1, wherein said first, third, fourth and sixth semiconductor areas are of said first conduction type; said second and fifth semiconductor areas are of said second conduction type.

11. A symmetric bidirectional silicon-controlled rectifier according to claim 1, wherein said first conduction type is N-type, and said second conduction type is P-type.

12. A symmetric bidirectional silicon-controlled rectifier according to claim 1, wherein said first conduction type is P-type, and said second conduction type is N-type.

13. A symmetric bidirectional silicon-controlled rectifier according to claim 1, wherein said first gate, said first semiconductor area and said second semiconductor area are connected to an anode; said second gate, said fourth semiconductor and said fifth semiconductor area are connected to a cathode.

14. A symmetric bidirectional silicon-controlled rectifier according to claim 1, wherein said first gate, said first semiconductor area and said second semiconductor area are connected to an cathode; said second gate, said fourth semiconductor and said fifth semiconductor area are connected to a anode.

15. A symmetric bidirectional silicon-controlled rectifier according to claim 1, wherein said middle region is an undoped epitaxial layer or a doped epitaxial layer of said first conduction type.

16. A symmetric bidirectional silicon-controlled rectifier according to claim 1, wherein said middle region is an epitaxial layer of said first conduction type or a well of said first conduction type.

17. A symmetric bidirectional silicon-controlled rectifier according to claim 1 further comprising a floating gate formed over a region between said third semiconductor area and said sixth semiconductor area.

18. A symmetric bidirectional silicon-controlled rectifier according to claim 1, wherein the underneath of said middle region is said substrate of said second conduction type or said first buried layer.

* * * * *